(12) United States Patent
Turovets

(10) Patent No.: US 10,978,321 B2
(45) Date of Patent: Apr. 13, 2021

(54) METHOD AND SYSTEM FOR PROCESSING PATTERNED STRUCTURES

(71) Applicant: NOVA MEASURING INSTRUMENTS LTD., Rehovot (IL)

(72) Inventor: Igor Turovets, Moshav Givat Yarim (IL)

(73) Assignee: NOVA MEASURING INSTRUMENTS LTD., Rehovot (IL)

( * ) Notice: Subject to any disclaimer, the term of this patent is extended or adjusted under 35 U.S.C. 154(b) by 323 days.

(21) Appl. No.: 16/067,202

(22) PCT Filed: Dec. 29, 2016

(86) PCT No.: PCT/IL2016/051403
§ 371 (c)(1),
(2) Date: Jun. 29, 2018

(87) PCT Pub. No.: WO2017/115377
PCT Pub. Date: Jul. 6, 2017

(65) Prior Publication Data
US 2019/0027386 A1   Jan. 24, 2019

Related U.S. Application Data

(60) Provisional application No. 62/273,490, filed on Dec. 31, 2015.

(51) Int. Cl.
*H01L 21/67* (2006.01)
*H01L 21/3105* (2006.01)
(Continued)

(52) U.S. Cl.
CPC .. *H01L 21/67248* (2013.01); *H01L 21/31053* (2013.01); *H01L 21/3212* (2013.01);
(Continued)

(58) Field of Classification Search
CPC ......... H01L 21/67248; H01L 21/31053; H01L 21/3212; H01L 21/67115; H01L 22/12; H01L 22/20; H01L 22/26
See application file for complete search history.

(56) References Cited

U.S. PATENT DOCUMENTS 5,196,353 A   3/1993  Sandhu et al.
5,258,824 A   11/1993 Carlson et al.
(Continued)

FOREIGN PATENT DOCUMENTS

JP   H088237 A    1/1996
JP   H08306673 A  11/1996
(Continued)

OTHER PUBLICATIONS

Williams, et al., Etch Rates for micromachining processing, Journal of Microelectromechanical systems, Dec. 1996, pp. 256-269, vol. 5, No. 4.

*Primary Examiner* — Dung Van Nguyen
(74) *Attorney, Agent, or Firm* — Browdy and Neimark, PLLC

(57) ABSTRACT

A system and method are presented for controlling a process applied to a structure comprising at least one of material removal and material deposition processes. The system comprises: a heating radiation source configured and operable to generate a temperature field profile across a processing area of the structure; and a control unit configured and operable to control operation of said heating radiation source in accordance with a predetermined pattern map within the processing area, so as to create a corresponding pattern selective profile of said temperature field across said processing area providing desired pattern selective distribution of at least one parameter characterizing the process applied to the processing area of the structure.

30 Claims, 5 Drawing Sheets

(51) Int. Cl.
*H01L 21/321* (2006.01)
*H01L 21/66* (2006.01)

(52) U.S. Cl.
CPC ........ *H01L 21/67115* (2013.01); *H01L 22/12* (2013.01); *H01L 22/20* (2013.01); *H01L 22/26* (2013.01)

(56) References Cited

U.S. PATENT DOCUMENTS

| | | |
|---|---|---|
| 5,376,233 A | 12/1994 | Man |
| 5,795,493 A | 8/1998 | Bukhman et al. |
| 6,358,360 B2 | 3/2002 | Takahashi |
| 6,379,222 B2 | 4/2002 | Wise et al. |
| 6,379,490 B1 | 4/2002 | Bollinger et al. |
| 6,746,616 B1 | 6/2004 | Fulford et al. |
| 6,812,069 B2 | 11/2004 | Tseng et al. |
| 6,994,611 B2 | 2/2006 | Svirchevski et al. |
| 7,204,639 B1 | 4/2007 | Gotkis et al. |
| 7,510,974 B2 | 3/2009 | Li et al. |
| 8,654,562 B2 | 2/2014 | Deng et al. |
| 8,932,106 B2 * | 1/2015 | Fukushima ........... B24B 37/005 451/5 |
| 10,226,852 B2 | 3/2019 | Turovets |
| 2003/0008600 A1 * | 1/2003 | Ide ........................ B24B 37/013 451/41 |
| 2003/0119429 A1 * | 6/2003 | Bright .................... B24B 37/30 451/67 |
| 2006/0019587 A1 | 1/2006 | Deopura et al. |
| 2008/0042078 A1 | 2/2008 | England |
| 2009/0170320 A1 | 7/2009 | Heinrich et al. |
| 2013/0130187 A1 * | 5/2013 | Moroi ............... H01L 21/68771 432/32 |
| 2014/0220709 A1 | 8/2014 | Kimura et al. |
| 2016/0318148 A1 | 11/2016 | Turovets |

FOREIGN PATENT DOCUMENTS

| | | |
|---|---|---|
| JP | 2000228391 A | 8/2000 |
| JP | 2012510161 A | 4/2012 |
| WO | 2009/085087 | 7/2009 |
| WO | 2010/062818 A2 | 6/2010 |
| WO | 2015101989 | 7/2015 |

* cited by examiner

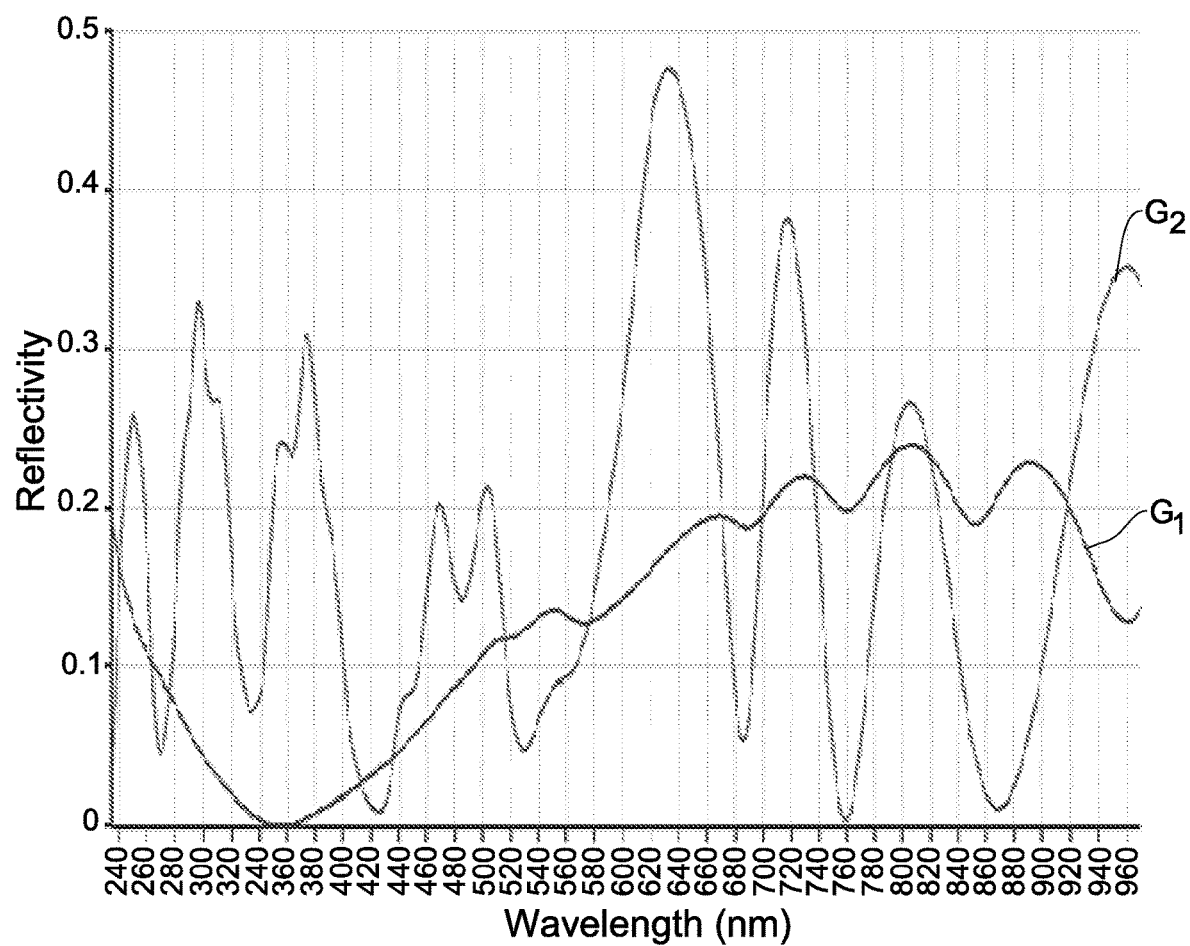
FIG. 1
(GENERAL ART)
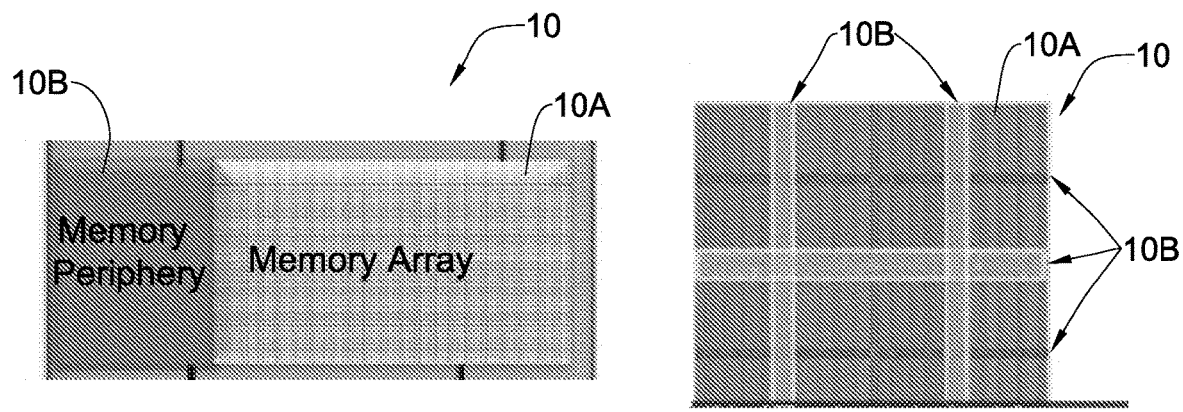
FIG. 2A
FIG. 2B

METHOD AND SYSTEM FOR PROCESSING PATTERNED STRUCTURES

TECHNOLOGICAL FIELD AND BACKGROUND

The present invention is in the field of manufacture of patterned structures, and relates to a method and system for controlling the patterning stage, in particularly useful for manufacturing semiconductor devices.

The manufacture of semiconductor devices includes several procedures applied to a semiconductor wafer to define active and passive elements of the device. The semiconductor wafer is prepared and one or more layers are deposited thereon. Thereafter, the process of photolithography is performed, in which the surface of a wafer is formed with a pattern conforming to circuit elements. An etching (material removal) process applied to the uppermost layer follows the photolithography. Etch pattern is usually filled with desired material/materials, and Chemical Mechanical Polishing (CMP) is applied to remove excess of material/s, create flat top surface, etc. These steps of material deposition and material removal are repeated to create a desired multi-layer patterned structure. Thus, the structure undergoing the inspection is that resulting from the final etching procedure, i.e., with the complete layer pattern.

Techniques for controlling the material removal processes have been developed. For example, WO 2015/101989, assigned to the assignee of the present application, describes a surface planarization system utilizing an external energy source for generating a localized energy distribution within a processing region, and a control unit for operating the external energy source to create, by the localized energy distribution, a predetermined temperature pattern within the processing region. The temperature pattern is such that different locations of the processing region are subjected to different temperatures. This provides that when a sample (e.g. semiconductor wafer) during its interaction with an etching material composition is located in the processing region, the temperature pattern at different locations of the sample's surface creates different material removal rates by the etching material composition (different etch rates).

Methods for control of material removal rate with wafer temperature for Dry etch are also known. For example, US 2014/0220709 describes a technique for controlling CD and CD uniformity with trim time and temperature on a wafer by wafer basis, according to which a plasma processing system is utilized having a wafer support assembly including a plurality of independently controllable temperature control zones across a chuck and a controller that controls each temperature control zone. For all these cases wafer is heated through a special chuck that allows to create radial distribution of the temperature and/or "localized" heating with a "spatial" resolution of a few millimeters.

GENERAL DESCRIPTION

There is a need in the art for a novel material removal process allowing localized heating processes with a spatial resolution at the order of structures inside the die.

The known techniques of the kind specified are capable of providing localized heating, but this localization is not related to the fields/dies on the wafer, and to the structure of the die. According to the known technique, all structures on the wafer that are in proximity to a certain "heating point" or "heating element" becomes heated together, so that the etch rate variations occur solely across the wafer variability (e.g. multizone heating chuck for etching).

The present invention takes an advantage of the technique described in WO 2015/101989, assigned to the assignee of the present application, according to which the material removal/deposition process (generally a patterning process/stage) includes subjecting the structure under such processing to a predetermined temperature pattern within the processing region such that different locations of the processing region are subjected to different temperatures. However, the present invention provides a novel material removal technique based on "pattern selective" heating that is "selective" to the certain structures/features inside the die. This technique provides "selectivity" on small scale, allowing to treat within the die variations. This "small scale" technique may be used in addition to the large scale variations, such as within the wafer variations, as described for example in WO 2015/101989.

The technique of the present invention can be used for improving performance of different processes in the semiconductor industry, such as wet/dry and atomic layer etch (ALE), Chemical Mechanical Planarization (CMP), and deposition, including atomic layer deposition (ALD). The patterning process (material removal and/or deposition) of the present invention can be performed by a stand-alone (SA) tool, or as a re-work/verification SA station for correction after the standard CMP process; or can be performed by an integrated tool with the conventional material removal/deposition system, e.g. may follow the rough removal/deposition stage. As an example, the present invention may be used for the fine tuning and/or correcting and/or improving of a material removal tool (e.g. CMP) performance, at various possible configurations.

The "pattern selective" based material removal according to the invention can be used for partial removal of a target material up to the desired target thickness, as well as for complete removal of the target material or materials. The term "pattern selective" or "pattern selectivity" used herein signifies that, while the entire sample's surface is subjected to a material removal/deposition processing, the material removal/deposition parameter(s) (e.g. process rate) within a region having certain pattern parameters (e.g. pattern density) is different from any other region of the sample's surface having different pattern parameters (e.g. pattern density). It should also be understood that considering material removal by selective etching, the invention provides for a combination of "chemical selectivity" and "pattern selectivity". Also, it should be understood that the terms "region of lower pattern density" and "region having a relatively low pattern density" used herein are relative terms, and for the purposes of the present application these terms should be interpreted broadly referring also to an un-patterned region.

Thus, the technique of the present invention provides for pattern selective removal of a target material from the processing area in a structure comprising different regions, being regions with different patterns, e.g. having different pattern densities, or patterned and un-patterned regions. In case of using an etching process as material removal, the invention utilizes both chemical selectivity and pattern selectivity for removal of a target material from target patterns. Such structures undergoing material removal/deposition patterning stage may be semiconductor devices (dies). The technique of the invention provides for defining increased etch rate at such target patterns due to the local heating of the target pattern.

In the description below, material removal is described as removal through selective wet etch process, but it should be understood that the invention is not limited to this specific type of material removal and can be also applicable to any other selective removal or deposition processes with high temperature dependence. Also, it should be understood that for the purposes of the present application the material removal should be interpreted broadly covering both a partial removal of the material up to the target thickness on the target patterns, and the complete removal of the target material or materials. A predetermined temperature pattern across the processing area created by the technique of the present invention provides localized change of temperature by application of the electromagnetic radiation that is selectively absorbed by the target patterns of different pattern parameters (e.g. pattern densities) within the processing area in a structure. Electromagnetic radiation can be presented by a part of the wavelength range where absorption in the desired pattern (e.g. of a higher pattern density) is larger than absorption in the surrounding regions (e.g. un-patterned regions) within the processing area.

Considering at least partial removal of target material(s) from the target patterns (e.g. in the die) through selective wet etch process, this includes application of etch reagents delivery system (nozzle), rotation mechanism for creating a paddle, and external source of heating electromagnetic radiation that allow localized heating of specific target patterns, and also optionally includes application of a metrology module/system (referred hereto below as an optical unit) for real time in-situ material removal control.

The technique of the invention is not limited to any specific type of wet etching and/or any specific etch agents. The wet etching process and etch agents used in such process are generally known and do not form part of the present invention, and therefore need not be specifically described. Examples of selective etch agents and temperature dependence of selective etch micromachining processes can be found for example in the paper by K. R Williams and R. S Muller in Journal of microelectromechanical systems, Vol, No 4, p 256-269, December 1996 *"Etch Rates for micromachining processing."*.

Localized heating of the target patterns can be done by selecting a part of the electromagnetic spectrum of an external source (e.g. lamps, lasers, LED's, Laser Diodes, etc.). Required temperature rise and duration of the temperature rise are determined (calculated) based on the measurements of the incoming material. Localized heating can be done by any pulsed, CW and/or scanning sources.

The invention can similarly be used for removal/deposition of target material(s) onto/from the target patterns on different substrates, such as semiconductor wafers, plastics, glass, etc., e.g. used for manufacturing of electronic components, such as LCD screens, MEMS, Systems on Chip (SOC), advanced memory and logic devices, power switches, etc.

Thus, according to one broad aspect of the invention, there is provided a system for controlling a process applied to a structure comprising at least one of material removal and material deposition processes, the system comprising: a heating radiation source configured and operable to generate a temperature field within a processing area of the structure; and a control unit configured and operable to control operation of said heating radiation source in accordance with a predetermined pattern map within the processing area, so as to create a corresponding pattern of said temperature field across said processing area providing pattern selective profile of at least one parameter characterizing the process applied to the processing area of the structure.

In some embodiments, the pattern selective profile of the process parameter characterizes a rate of the process being applied to the structure, such that regions of the processing area having different patterns (different pattern parameters) are subjected to different temperatures creating different rates/evolution of the process being concurrently applied to the different regions across the processing area, as a multi-step processing, based on the target amount of material to be removed/deposited at these different regions at each step.

In some embodiments, the patterns are different from one another in the pattern density, e.g. patterned and un-patterned regions constituting, respectively, regions of relatively high and relatively low pattern densities. Thus, in these embodiments, the pattern map is indicative of a pattern density map data.

The control unit comprises an analyzer module configured to receive and analyze input data about the structure (its processing area) and generate operational data to the heating radiation source. In some embodiments, the input data comprises the pattern layout map data (e.g. including pattern density map) and data indicative of a (heating radiation) absorption map of the regions within the processing area. The operational data is indicative of one or more selected parameters of the heating radiation to be applied for selective heating of one or more selected regions of the processing area in accordance with the pattern layout map, i.e. pattern parameter(s) in said one or more selected regions and amount of material to be removed/deposited. Such one or more parameters of the heating radiation included in the operational data may be one or more of the following: spectral range (e.g. various intensity per wavelengths, like spectrum), and/or polarization and/or intensity and/or application time/pulse duration/number of pulses per step, and number of steps.

The (heating radiation) absorption map across the processing area of the structure is actually indicative of variation of the absorption properties within the processing area, which depends on the pattern map in the processing area and the heating radiation parameter(s) such as wavelength and/or polarization. Thus, in some embodiments, the absorption map includes a spectral map comprising data indicative of absorption spectra of the regions of different pattern parameters within the processing area.

It should be understood that, generally, the pattern map data and absorption map data of the structure within the processing area are used for determining the optimal temperature field pattern across the structure to be applied during the material removal/deposition process. Application time and/or multistep sequence is defined by this temperature field pattern and the amount of material to be removed/deposited from/to the structure. The absorption properties across the processing area with respect to for specific heating radiation depend on various pattern parameters, such as profile, layout, density, materials, etc. The pattern density parameter is the major factor affecting the material removal/deposition rate, and the invention is exemplified below with respect to this specific application. However, it should be understood that the principles of the invention are not limited to this specific example of the control of such process parameter as its rate/evolution, as well as not limited to the specific example of pattern density parameter.

In the description below the absorption map is referred to as spectral map, but it should be understood that this a non-limiting example, and other parameters/condition(s), such as polarization may alternatively or additionally affect the absorption map across the processing area.

For example, the selected spectral range includes a spectral range of a relatively weak absorption by one or more regions of the processing area having relatively low pattern density (e.g. un-patterned region(s)), as compared to that of the selected region(s) which have relatively high pattern density. In some other embodiments, the selected region(s) include (e.g. additionally) region(s) having relatively low pattern density, in which case the selected spectral range (also) includes a spectral range of a relatively weak absorption by one or more regions of the processing area having relatively high pattern density.

In some embodiments, the control unit is configured for data communication with a measurement/inspection system (at times referred to herein below as optical unit), which is configured to apply optical (e.g. spectral) measurements to the processing area of the structure using variation of at least one parameter/condition of the heating radiation and provide either the absorption map (e.g. spectral map) data or measured data from which such absorption map data can be derived (by the control unit).

In some embodiments, the control unit is configured for data communication with an imaging unit/system (which may be part of the same measurement/inspection system) which provides image data about the processing area. Such image data may include the pattern map data, or the control unit can apply appropriate image processing to the image data to determine the pattern map data.

In some embodiments, the control unit is configured for data communication with an external system (e.g. storage system) to receive therefrom the input data including the pattern map data and/or the absorption map data of the processing area in the structure to be processed.

In some embodiments, the heating radiation source is configured and operable as a material removal tool for performing the material removal process. For example, the heating radiation source may be used for performing a fine material removal process stage after a rough CMP process stage. In some other embodiments the heating radiation is applied concurrently with material removal process of a different type, e.g. concurrently with the etching process.

According to another broad aspect of the invention, there is provided a processing system for processing a structure by applying to a processing area thereof at least one of material removal and material deposition processes, the processing system comprising: a processing tool comprising a heating radiation source configured and operable to generate a temperature field profile across the processing area of the structure; and the above described control unit for operating the heating radiation source.

According to yet further aspect of the invention, it provides a chemical mechanical polishing (CMP) system comprising: at least one CMP station for applying a rough CMP processing to a structure, and the above-described processing system for applying a fine CMP processing to the structure after the rough CMP processing of said structure.

The invention also provides a method for controlling processing of a structure by at least one of material removal and material deposition processes applied to a processing area of the structure comprising different pattern. The method comprises: providing input data comprising data indicative of a pattern map within the processing area and corresponding absorption map data with respect to predetermined electromagnetic radiation; analyzing the input data and generating operational data indicative of electromagnetic radiation to be applied to the processing area during said patterning to create a pattern selective temperature field profile across the processing area such that the different pattern regions of the processing area are subjected to different pattern selective temperatures differently affecting one or more parameters of said patterning process being applied to the structure.

BRIEF DESCRIPTION OF THE DRAWINGS

In order to better understand the subject matter that is disclosed herein and to exemplify how it may be carried out in practice, embodiments will now be described, by way of non-limiting examples only, with reference to the accompanying drawings, in which:

FIG. 1 exemplifies reflectance spectra of an exemplary structure configured as a Phase-Change Memory (PCM) device, demonstrating different spectral response memory array and logic regions constituting regions of different pattern parameters (e.g. different pattern densities);

FIGS. 2A and 2B show two different examples, respectively, of the configuration of the processing area in a memory device, including higher pattern density region (memory array) and lower pattern density region (periphery);

DETAILED DESCRIPTION OF EMBODIMENTS

Figure 3:
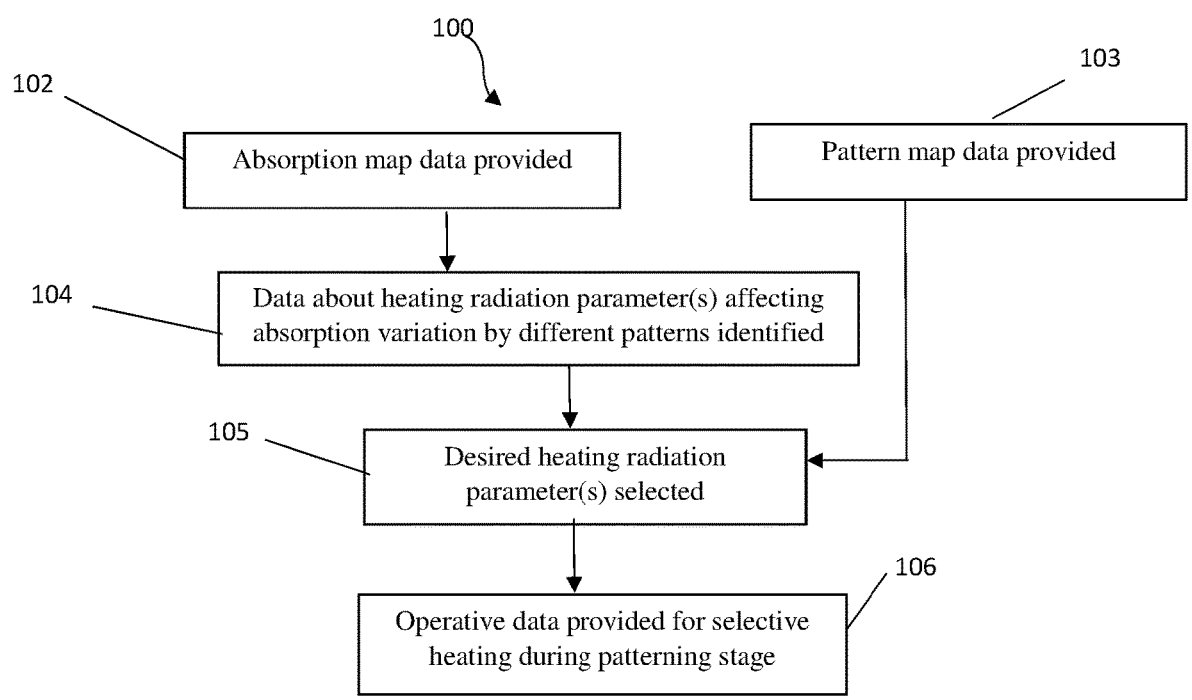
FIG. 3 is a flow diagram of a method according to the present invention which can be used to optimize a patterning stage applied to a structure having regions with different patterns, typically material removal and/or material deposition stages.

As indicated above, the technique of the present invention, based on "pattern selective" heating, can be used for improving performance of different patterning processes in the semiconductor industry, including material removal processes, such as wet/dry and ALE etch, CMP, and material deposition processes, including ALD.

In semiconductor manufacturing, different type of devices are created, such as logic devices, memory devices, controllers, etc. In majority of the cases, both a memory part and a logic part are presented in the device: for logic devices this memory part is called "embedded", while for memory devices logic (circuit) part is called "periphery logic". In some of the System On Chip (SoC) devices there may be more building blocks, than just memory and logic. Different devices may have different design rules, feature sizes, materials, and different processing.

For simplicity, let us consider a patterned structure (electronic device) defining memory and periphery logic. Using memory devices as an example, the process steps that are required for creation of a pattern of the periphery circuit (logic) part/region and a pattern of the memory array part/region of the memory device are different for all types of memory. In some devices, such as Dynamic Random-Access Memory (DRAM), NAND/NOR logic gates, memory arrays (pattern) and periphery logic (pattern) are created as part of front end processes, while for other memory types, such as 3D NAND, Phase-Change Memory (PCM), 3D RRAM, memory part can be created also at the back end of line after the logic part is completed (embedded memory).

In majority of these cases, when the memory part is being patterned, the periphery logic part is blocked (masked), and vice versa. This creates a lot of problems for all the processing steps that are sensitive to the density and to the micro loading effects. For example, if dry etch process is used to create dense arrays separated by un-patterned periphery logic areas, it will be difficult to maintain same process in the middle and at the edge of the array.

As indicated above, the present invention provides for performing/assisting a material removal/deposition process by application of temperature field profile/pattern across the processing area of a structure of the type having different pattern regions, i.e. regions of different pattern parameters, such as profile, layout, density, materials, etc. This is aimed at providing a desired profile of the process parameter(s) across the processing area. In the description below, the invention is described by non-limiting examples where the process parameter to be appropriately varied across the processing area is the process rate, the pattern parameter by which the regions are different from one another is the pattern density, and the heating radiation parameter(s) selected to create the desired temperature field profile is the spectral range of the heating radiation.

The main process that is affected by pattern density variations is CMP. When polishing a wafer that has step features, only the top of the features touch the polishing pad, concentrating the pressure on these contact points. This causes non-uniformity in the material removal rate across patterns of different densities, because of variations in the pressure distribution across the pattern. This pattern density effect on the material removal rate can cause problems in case of very dense and very sparse pattern in the structure. Thus, for CMP, it is extremely difficult to maintain the same material removal rate for a structure with patterns of different densities. Also, it is difficult to maintain clear boundary on the edge of the arrays, because of enhanced polishing in such region resulting in erosion of the field material. Multiple dummification schemes were proposed to solve this problem at the structure level, namely by minimizing pattern density variations across the structure to create dummy patterns (shapes) around the sparse pattern to try and match the higher pattern density. Known techniques aimed at improving semiconductor process wafer CMP uniformity (e.g. as described in U.S. Pat. No. 6,812,069) cannot be used with pattern structures having high pattern density, or might provide only a partial help for memory arrays surrounded by the periphery area, that can be of different density or may be patterned at the later process step.

The technique of the present invention provides a different approach for solving the generalization of the above problem, by improving a material removal process or material deposition process. The solution provided by the present invention allows both eliminating the most problematic "stop on" and over polish CMP process steps and creating possibility to optimize material removal/deposition on regions of a structure having variable pattern density, such as for example memory array region and periphery circuit (logic) region. Considering a memory device as an example of such structure having regions of different pattern densities, the pattern density in the memory array area/region is higher than that in the periphery circuit area/region. The present invention, in some embodiments, provides for improving last steps of a CMP process on patterns with variable density, and especially for the cases of dense memory arrays separated by the un-patterned periphery logic areas.

The technique of the present invention is based on different optical properties of structure regions with different layouts, or pattern parameters, e.g. densities (i.e. density of the features of the pattern) in said regions. Such regions of different layouts, or pattern densities are characterized by different optical responses to incident electromagnetic radiation, due to different absorption properties with respect to said electromagnetic radiation.

In this connection, reference is made to FIG. 1 exemplifying reflectance spectra (spectral optical response) of a Phase-Change Memory (PCM) structure/device. Graphs $G_1$ and $G_2$ shown in the figure correspond to, respectively, the spectral response from the memory array region/part of the structure and the spectral response from the logic periphery part of the structure. As indicated above, such memory array and logic regions have patterns of different densities. It is evident from the figure that such regions with different pattern densities differently absorb/reflect wavelengths of different spectral ranges.

According to the invention, a spectral range, which is less absorbed by the smaller-density pattern region (e.g. un-patterned region) as compared to that of the higher density pattern is chosen to be used for selective heating of the higher-density pattern regions during the material removal process. Alternatively or additionally, an opposite selection can be used: a spectral range of preferential periphery absorption (by lower pattern density region) can be used for selective treatment of the periphery region.

These selections can be used in any sequence defined by the process needs as a multi-step processing.

Considering the example of FIG. 1, the spectral range around 300 nm is characterized by relatively low (zero, negligible) reflectance (higher absorption) at the memory array region having a higher-density pattern, as compared to relatively high (30%) reflection from (smaller absorption at) the logic periphery which has relatively low-density pattern. Hence, higher absorption property of the memory array region for this spectral range can be used to heat the memory array region to the higher temperatures, as compared to the periphery region.

If a sample/structure undergoing material removal processing is also immerged in wet etch chemical mixture, temperature rise on the array surface (higher-density pattern region) will affect selective etch rate and ensure material removal from the area above the array.

FIGS. 2A and 2B show two exemplary structures (chips), generally designated 10, configured as memory devices. As shown, each such structure includes higher pattern density region(s) 10A (memory array) and lower pattern density region(s) 10B (periphery). Generally, for the purposes of the present application, regions 10A and 10B exemplify regions of different pattern parameter(s).

Reference is made to FIG. 3 showing a flow diagram 100 of a method according to the present invention which can be used to optimize a patterning stage applied to a structure having different pattern regions (regions with different pattern parameter(s), e.g. different pattern densities). Such patterning stage typically includes material removal and/or material deposition process.

Initially, input data is provided including absorption map data (e.g. spectral map data) for at least some regions of a processing area in a structure to be processed (step 102), as well as pattern map data (e.g. density map data) of said processing area (step 103). The process parameter to be controlled (pattern selectively) during the processing stage may be the processing rate (e.g. that of CMP removal, etching, etc.). Such process parameter(s) depend(s) on the structure under processing (pattern parameters, e.g. density). The invention is aimed at locally affecting the processing rate depending on the structure parameters, embedded in the input data (pattern map data and absorption map data). Such local (selective) affecting of the processing rate could be done by selective heating (e.g. selective overheating) of specific selected region(s) in the processing area and getting desired temperature distribution/profile across the processing area.

Selective heating of a specific region in the processing area can be achieved by choosing appropriate parameter(s) of the heating electromagnetic radiation to be applied to said region depending on the parameter(s) of the structure in said region (and adjacent regions), e.g. specific wavelength(s), polarization of the electromagnetic radiation. It should be understood that the heating electromagnetic radiation is applied to the entire processing area and thus the adjacent regions are also subjected to the electromagnetic radiation together with said selected region, but owing to the fact that the absorption properties of said adjacent regions are different with respect to the electromagnetic radiation of the selected parameter(s) they absorb less (or more) energy. Hence, such adjacent (not selected) regions will be heated less (or more) than the selected region. This provides a desired pattern/profile of temperature field distribution across the processing area depending on the different pattern regions and provides desired profile of the rate of processing (e.g. material removal, deposition).

The absorption map data may include spectral map data may indicative of electromagnetic spectral range(s) that is/are absorbed in a different way by different pattern regions in the processing area, e.g. relatively high density pattern region (e.g. the memory array) and relatively low density pattern region (e.g. periphery circuit). Alternatively, this absorption map data (e.g. spectral map data) may be used/analyzed to identify the electromagnetic radiation having parameter(s), e.g. spectral range(s), differently absorbed by different pattern regions, e.g. differing from one another in the pattern density (optional step 104). As indicated above, the term "relatively low density pattern region" refers also to un-patterned regions. The absorption map data (e.g. spectral map data) could be provided by simulation (using e.g. rigorous or approximated models of the structure(s)), or by preliminary measurements of regions of interest on the structure.

Then, the desired heating radiation parameter(s) is/are chosen (step 105). This may include at least a part of the spectral range for which absorption by the low pattern density region (periphery region) is smaller than absorption by the high pattern density region (or opposite selection scheme). Corresponding operative data is then generated (step 106) to be used for providing a desired temperature profile across the processing area, for example to provide selective heating of the high pattern density region(s) (or low pattern density region(s), as the case may be) in the respective patterning stage.

The principles of the present invention can be used for controlling a material deposition process, as well, in order to selectively enhance the material deposition in the selected region(s), e.g. enhance the material deposition over the heated higher density pattern region(s). As indicated above, the same principle can be used to choose the heating radiation parameter(s), e.g. spectral range, with respect to the preferential periphery absorption properties for selective treatment of periphery region.

Figure 4:
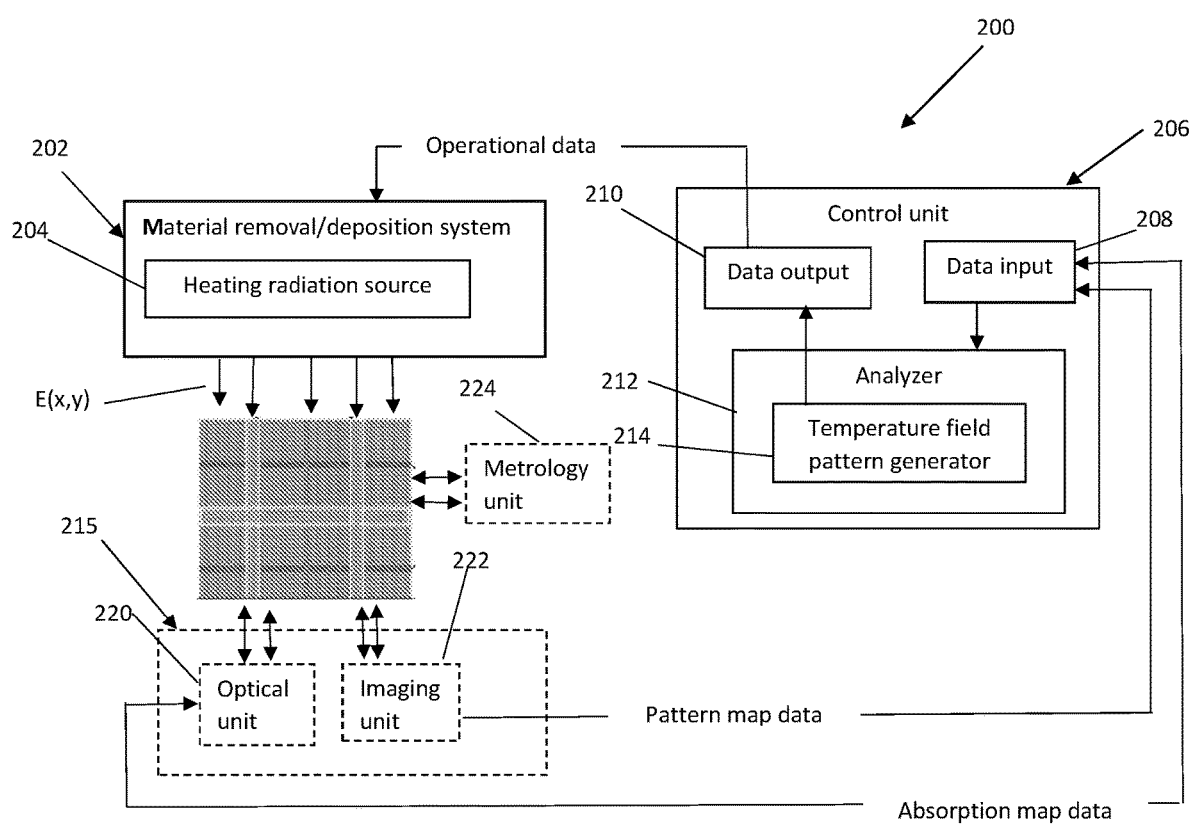
FIG. 4 is a block diagram of a system of the present invention for use in controlling the operation of a patterning tool/system, such as material removal system to be applied to a sample/structure having regions of different patterns.

Reference is now made to FIG. 4 schematically illustrating a system 200 of the present invention for use in controlling the operation of a patterning tool/system 202, such as material removal system to be applied to a sample/structure 10 having regions of different pattern parameters (e.g. pattern densities) 10A and 10B. It should be noted, although not specifically shown, that such material removal system 202 may utilize a CMP tool (polisher) and/or an etcher; in the latter case the sample 10 undergoing the material removal processing interacts with (is coated by/embedded in) etching material(s).

According to the invention, the patterning system 202 includes a heating radiation source 204. In case the material removal process utilizes etching technique, then the heating radiation source 204 alone can be used to provide a desired "pattern selective" profile of the effective etching parameter (e.g. rate) across the structure. If the use of a CMP polisher is considered, then the heating radiation source is used in addition to the polisher to apply a desired "pattern selective" temperature pattern/profile across the sample (the processing area in the sample) and thus provide a desired "pattern selective" profile of the effective polishing parameter (e.g. rate) across the sample. To this end, the heating radiation source (i.e. temperature pattern) may be applied concurrently with the polisher, or may be used only during the last stage of polishing. More specifically, the CMP process may include a first "rough" CMP stage, following by a second "fine" CMP stage during which the pattern selective temperature pattern is applied.

Thus, the system 200 includes a heating radiation source 204 and a control unit 206. As shown in the figure by dashed lines, the system may also be associated with a measurement/inspection system 215 including optical and/or imaging units 220, 222 (the purposes of which will be described further below), and possible also a metrology unit 224 (which will also be described below). The control unit 106 may be part of any of such units 220, 222, 224 if used; or may be a stand-alone device (computer device) configured for data communication (e.g. via wireless data communication) with the heating radiation source 204 and input data supplier. The latter may include any storage device and/or the measurement/inspection system 215.

The heating radiation source 204 is configured and operable by the control unit 206 to generate a heating energy profile E(x,y) (map) across the processing area of the structure to create a predetermined temperature pattern across the processing area, such that regions 10A and 10B having different pattern parameters (e.g. pattern densities) are subjected to different temperatures during the material removal/deposition process being applied to the processing area. By this, desired profile of the process parameter(s), e.g. process rate profile (e.g. material removal/deposition rate profile) across the processing area of the structure is achieved.

The heating radiation source may generally be of any known suitable type, e.g. electric, optical, magnetic, e.g. using pulsed or CW radiation. In a non-limiting example, the heating radiation source may include one or more (e.g. array, matrix) of heater(s) (e.g. radiation element(s)) appropriately positioned with respect to the processing area of the structure, such that actuation of the pattern selective heater(s) with required operational data (heating temperature, operational mode (e.g. pulses), duration of heating, pulse shape, time pattern of pulses) creates a pattern selective temperature pattern across the processing area.

The control unit 206 is configured for generating operating data to the heating radiation source 202 to create the pattern selective temperature distribution within the processing area including different pattern regions (e.g. with different pattern densities). When the structure (its processing area) with such pattern selective temperature profile undergoes material removal/deposition (e.g. interacts with a suitable etching/deposition material composition), a corresponding pattern selective profile of the material removal/deposition parameter (e.g. rate), defined by the temperature pattern, is created across the interaction interface.

The control unit 206 is typically an electronic/computer system including inter alia such utilities (hardware and/or software) as data input utility 208, data output utility 210, and an analyzer 212. The analyzer 212 is a data processor comprising a temperature field pattern generator module configured (to execute predetermined algorithms) to process the input data, including pattern map data (e.g. pattern density map data) in the processing area of the structure and absorption map data (e.g. spectral map data), and to generate data indicative of the desired temperature field pattern/profile, which is transmitted, as operational data to the heating radiation source 204.

It should be understood that in some embodiments of the invention the input data indicative of the pattern map (i.e. locations/arrangement of the regions which are to undergo material removal/deposition patterning stage and the respective pattern parameters (e.g. densities) within these regions) may be input to the control unit. The pattern map data may be received directly from the inspection/measurement system 215, e.g. the imaging unit (on-line operational mode) or from a storage device (off-line mode). Similarly, the input data indicative of the absorption map (e.g. absorption spectra across the processing area) may be input to the control unit being either received directly from the same or another inspection/measurement system, e.g. optical unit (on-line operational mode) or from a storage device (off-line mode).

The analyzer module 212 of the control unit may be preprogrammed for analyzing the input data (the pattern map and the absorption map), and determining the selected one or more parameters (e.g. spectral range(s)) of the electromagnetic radiation to be applied to selected region(s) within the processing area, and generate the corresponding operational data to the heating radiation source to produce the corresponding temperature pattern across the processing area during the patterning stage. The data processing algorithms of the analyzer module 212 may be distributed between the inspection/measurement system (optical and/or imaging and/or metrology units) and the control unit; or between the patterning system and the control unit; or all of these systems/units.

The material removal/deposition system 202 may be associated with an in-situ measurement system 215 (e.g. unit(s) 220 and/or 222 and/or 224) used for the process control. Such system 215 applies measurements (e.g. optical) to the processing area of the structure during the pattern selective material removal/deposition process performed by system 202 (i.e. performed by or assisted by the heating radiation source operation) and supplies the measurement results to the control unit 206 for updating/modifying the operational data to control the working parameters of the heating radiation source and thus controlling the pattern selective material removal/deposition process. It should also be noted that such measurement system for real time in-situ material removal (e.g. selective wet etch) can be further configured for monitoring composition/concentration of the etch solution instead or in addition to the measurement of structure's parameters.

The pattern selective material removal/deposition technique of the present invention (i.e. different levels (e.g. rates) of material removal/deposition in regions of different patterns (e.g. different pattern densities) within the processing area of the structure) can be used with any material removal/deposition process which has temperature dependence. It should also be understood that the etching mode itself (temperature/duration, etching material compositions) may utilize any suitable technique, which are generally known in the art of etching processes commonly used in in semiconductor industry.

The technique of the present invention may be used to create desired in-die topography as a process step following CMP planarization done as "stop in layer" CMP. The system of the invention may be implemented in at least two configurations. First configuration is when the control system of the invention is integrated/used as part of the existing CMP process equipment (located in the CMP sequence after the platen or platens), as additional module, or instead of the one of the platens, or instead of the last or buffing platen. In another possible configuration, the system of the invention can be used as a stand-alone tool for correction after the CMP process was completed.

The technique of the invention for the pattern selective and localized material removal from the desired pattern can improve current CMP tool performance, and allows better topography control inside the patterned structure (In-Die), and reduction/elimination of detrimental CMP effects: different erosion and dishing of different patterns and undesired density and edge effects. In this connection, reference is made to FIGS. 5A-5C; 6A-6C and 7A-7B.

Figure 5A:
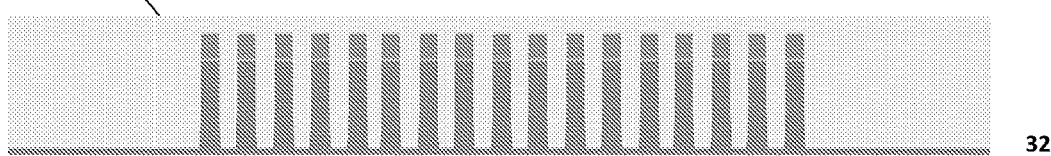
FIGS. 5A-5C, 6A-6C and 7A-7B show profile evolution in the ideal CMP process (FIGS. 5A-5C), "real" CMP process (FIGS. 6A-6C), and CMP process utilizing the principles of the invention (FIGS. 7A-7B).
Figure 5B:
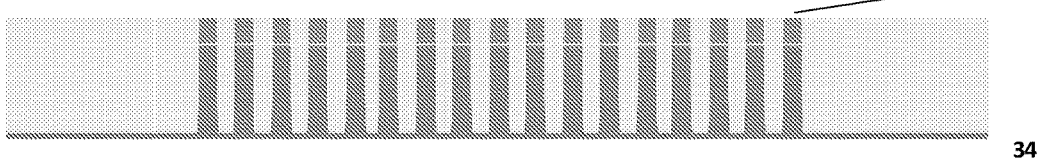
Figure 5C:
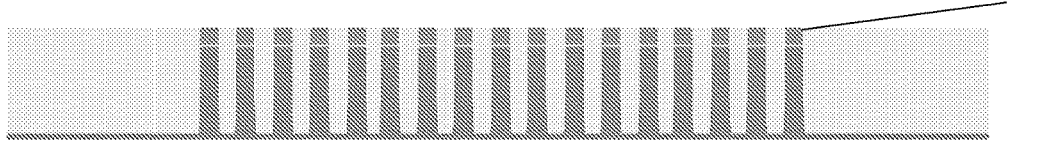

FIGS. 5A-5C show profile evolution in the ideal CMP process. It is shown that it is relatively easy to flatten the wafer's surface 30 (FIG. 5A), more difficult to have exact end point or stop-on next layer 32 (FIG. 5B), and even more difficult to do over polish 32 (FIG. 5C) without edge problems, dishing and/or erosion.

Figure 6A:
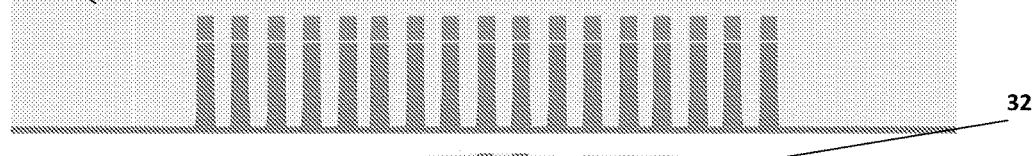
Figure 6B:
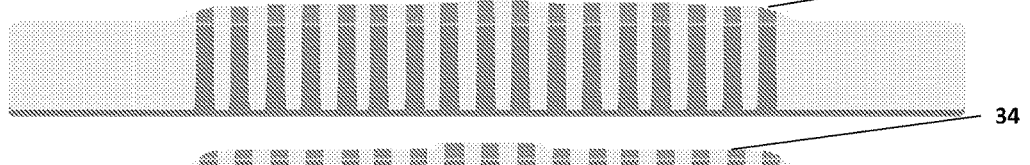
Figure 6C:
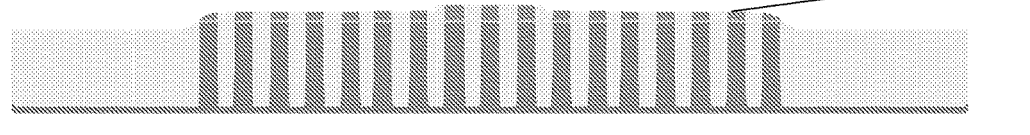

FIGS. 6A-6C show the profile evolution in "real" CMP process. In the real CMP, it is relatively east to flatten the wafer surface 30 (FIG. 6A), but at "end point" layer 32 different parts of array have in reality different profiles (FIG. 6B), and during over polish huge topography variations 34 can be created between array and periphery, including severe over polish of the edges of the array (FIG. 6C).

Figures 7A, 7B:
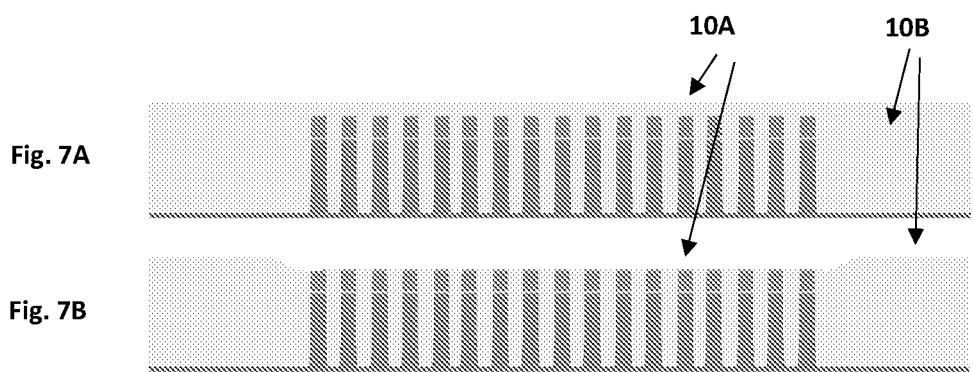

FIGS. 7A-7B illustrate the CMP process utilizing the principles of the invention. As shown, the CMP process makes planarity and stops in the layer above the required target array. Thickness of the remaining material can be measured and used as an input to calculate pattern selective wet etch process time, temperature, pulse duration, etc. (FIG. 7A). Expected profile after the selective wet etch (FIG. 7B) shows that larger amount of material is removed above the array (higher pattern density region 10A), ensuring no residues ("similar to overpolish"). Slightly smaller amount is removed around the array (lower pattern density region 10B), to ensure overall flatness and quality of the array edges.

The technique of the invention can be used together with the method for correction of WIW CMP non-uniformity ("the large scale variations"), as described in the above-mentioned WO 2015/101989, assigned to the assignee of the present application, which is incorporated herein by reference with respect to this specific example of the combined technique. In this case, overall topography variations can be controlled and minimized both across the die and across the wafer.

It should also be noted that all stop-on CMP steps (including, but not limiting to Oxide CMP with stop on SiN and/or SiN CMP with stop on Oxide, and/or Oxide CMP with stop on poly and/or W CMP with stop on Oxide and other stop-on steps) that have different array and periphery structures may benefit from the proposed approach.

As indicated above, the technique of the invention can be also used for other wet/dry etch and deposition processes, including ALE and ALD. Also, the principles of the present invention can be beneficial in all cases where only part of the die should be treated, such as embedded memory, and other cases. This method will become even more important for SOCs, that may integrate besides logic and memory also sensors, RF, electro-optical convertors and MEMS.

The present invention provides for advanced process control schemes. For example, the system of the invention may be used as an integrated part of the existing CMP tools arrangement (selective etch CMP module). In this case, an integrated metrology tool/system (configured for metrology measurements under wafer's dry or wet conditions) may be located after the platen or platens and before the selective etch CMP module (wet area). Such integrated metrology tool/system measures a wafer map of the target parameters after the CMP and define thickness of material to be removed from the target array (higher pattern density). This wafer map is used as Feed Forward advanced process control for the integrated selective etch CMP module of the present invention. It should be noted that the same wafer map may be optionally used as feedback advanced process control to CMP platen. In addition, a "dry" integrated metrology tool/system or stand-alone metrology tool/system can be used after completion of the improved material removal process (i.e. CMP selective etch CMP module of the invention) as a mean of overall process quality control.

In case the present invention is used as a separate stand-alone tool configuration for correction after the CMP, stand-alone metrology tool can be used to measure the wafer map of the required removal needs before the pattern selective wet etch process (feed forward advanced process control) and to assess the overall performance after the pattern selective wet etch process (feedback advanced process control).

The present invention can be implemented together with in-situ process control for the pattern selective material removal processes. In this case, the metrology module for real time in-situ material removal (selective wet etch) control may be used during the process. This metrology module allows precise measurement of at least the target thickness parameter at least at one target location, including, but not limiting, thickness of layer that is being partially/fully removed, and/or thickness of all other layers. In situ metrology results may be also used as an input to the end point detector (EPD) SW.

In-situ metrology and heating functions can be combined into the same module, where localized heating of the target array and measurement of the target parameters of the target arrays are done simultaneously with the same source (laser), in the step or scan fashions, at the same or different wavelength areas. Metrology and heating functions can be combined into the same module so that metrology measurement is being followed by the heating of the desired location on the wafer in the step by step mode.

As described above, one of the main applications of the pattern selective wet etch embodiments of the present invention is the controlled removal of thin layer above target arrays, after CMP "stop in layer" planarization only process. This can be used for the dense (memory) arrays surrounded by low density periphery areas and for packed dense arrays with overall averaged low density dies.

Besides these standard applications, the pattern selective wet etch process embodiments of the invention can be used for selective opening of the certain arrays only on the certain target locations both in-Die, and in-Wafer, with other structures being still covered. All this can be done based on the selective nature of the light absorption by high pattern density region (arrays), and by capability to use energy sources with filters/scanners to illuminate only part of the die and/or part of the dies on the wafer. This option may simplify processing and make integration easier. Selective opening of a certain locations on the wafer currently is done only by lithography. The above-described technique of the invention of pattern selective etch provides for eliminating additional lithography steps.

One of the possible examples of using the technique of the invention can be creation of air gaps in the low-K materials at BEOL. This is done by removal of low-K material only in the dense arrays, and not for isolated arrays/lines. Hence, the invention provides for selectively etched and "opened" layer only in the area of the dense structures, thereby creating air gaps directly in the required locations without doing additional lithography.

The invention claimed is:

1. A system for controlling a process applied to a structure comprising at least one of material removal and material deposition processes, the system comprising:
   a heating radiation source configured and operable to generate a temperature field profile across a processing area of the structure; and
   a control unit configured and operable to control operation of said heating radiation source in accordance with a predetermined pattern map within the processing area, so as to create a corresponding pattern selective profile of said temperature field across said processing area providing desired pattern selective distribution of at least one parameter characterizing the process applied to the processing area of the structure,
   wherein the control unit comprises an analyzer module configured to receive and analyze input data comprising the pattern map data and absorption map data indicative of absorption spectra of the regions of different pattern densities within the processing area, and generate operational data to the heating radiation source being indicative of one or more selected parameters of heating radiation to be applied to the processing area for pattern selective heating of one or more selected regions of the processing area.

2. The system according to claim 1, wherein said at least one process parameter comprises a rate of said process.

3. The system according to claim 1, wherein said pattern selective profile of the temperature field create different rates of said process being applied to the regions of different pattern parameters in the processing area.

4. The system according to claim 1, wherein said pattern map data is indicative of an arrangement of different pattern regions within the processing area.

5. The system according to claim 4, wherein said different pattern regions have different pattern densities.

6. The system according to claim 1, wherein said one or more selected parameters of the heating radiation comprise one or more of the following: spectral parameters; a spectral range of the heating radiation, polarization, intensity, heating radiation application time, pulse duration, number of pulses per step, number of steps.

7. The system according to claim 1, wherein said one or more selected parameters of the heating radiation comprise at least one of the following: (i) selected spectral range, comprising a spectral range of a relatively weak absorption by one or more regions of the processing area having relatively low pattern density, as compared to that of said one or more selected regions having relatively high pattern density; and (ii) selected spectral range comprising a spectral range of a relatively weak absorption by one or more regions of the processing area having relatively high pattern density, as compared to that of said one or more selected regions having relatively low pattern density.

8. The system according to claim 1, wherein said control unit is configured for data communication with a measurement system for receiving from said measurement system the input data comprising at least said pattern map data of the processing area and the absorption map data of the processing area.

9. The system according to claim 1, wherein the control unit is configured for data communication with an external system for receiving the input data from the external system.

10. The system according to claim 1, wherein said heating radiation source is configured and operable as a material removal tool for performing said material removal process.

11. The system according to claim 10, wherein said heating radiation source is configured and operable as the material removal tool for performing a fine material removal process stage on the processing area of the structure after a rough CMP process stage in single or multiple steps.

12. A processing system for processing a structure by applying to a processing area thereof at least one of material removal and material deposition processes, the processing system comprising:
a processing tool comprising a heating radiation source configured and operable to generate a temperature field profile across the processing area of the structure; and
a control unit configured and operable to control operation of said heating radiation source in accordance with a predetermined pattern map within the processing area, so as to create a corresponding pattern selective profile of said temperature field across said processing area providing desired pattern selective distribution of at least one parameter characterizing the process applied to the processing area of the structure,
wherein the control unit comprises an analyzer module configured to receive and analyze input data comprising the pattern map data and absorption map data within the processing area, and generate operational data to the heating radiation source being indicative of one or more selected parameters of heating radiation to be applied to the processing area for pattern selective heating of one or more selected regions of the processing area in single or multiple steps; and
wherein said absorption map data comprises data indicative of absorption spectra of the regions of different pattern densities within the processing area said one or more (i) selected parameters of the heating radiation comprising at least one of the following: selected spectral range, comprising a spectral range of a relatively weak absorption by one or more regions of the processing area having relatively low pattern density, as compared to that of said one or more selected regions having relatively high pattern density; and (ii) selected spectral range comprising a spectral range of a relatively weak absorption by one or more regions of the processing area having relatively high pattern density, as compared to that of said one or more selected regions having relatively low pattern density.

13. The processing system according to claim 12, wherein said at least one process parameter comprises a rate of said process.

14. The processing system according to claim 12, characterized by at least one of the following: (a) said pattern selective profile of the temperature field create different rates of said process being applied to the regions of different pattern parameters in the processing area; (b) said pattern map data is indicative of an arrangement of different pattern regions within the processing area.

15. The processing system according to claim 12, wherein said pattern map data is indicative of an arrangement of different pattern regions within the processing area, said different pattern regions having different pattern densities.

16. The processing system according to claim 12, characterized by at least one of the following: (1) said one or more selected parameters of the heating radiation comprise at least one spectral parameters; (2) said one or more selected parameters of the heating radiation comprise one or more of the following: a spectral range of the heating radiation, polarization, intensity, heating radiation application time, pulse duration, number of pulses per step, number of steps; (3) said absorption map data comprises data indicative of absorption spectra of the regions of different pattern densities within the processing area.

17. The processing system according to claim 12, wherein said control unit is configured for data communication with a measurement system for receiving from said measurement system the input data comprising at least said pattern map data of the processing area and the absorption map data of the processing area.

18. The processing system according to claim 12, wherein the control unit is configured for data communication with an external system for receiving the input data from the external system.

19. The processing system according to claim 12, wherein said heating radiation source is configured and operable as a material removal tool for performing said material removal process.

20. The processing system according to claim 19, wherein said heating radiation source is configured and operable as the material removal tool for performing a fine material removal process stage on the processing area of the structure after a rough CMP process stage.

21. A chemical mechanical polishing (CMP) system comprising: at least one CMP station for applying a rough CMP processing to a structure, and said processing system of claim 12, configured and operable for applying a fine CMP processing to said structure after said rough CMP processing.

22. A method for controlling processing of a structure by at least one of material removal and material deposition processes applied to a processing area of the structure comprising different pattern regions, the method comprising:
providing input data comprising data indicative of a pattern map within the processing area and corresponding absorption map data with respect to predetermined electromagnetic radiation;
analyzing the input data and generating operational data indicative of electromagnetic radiation to be applied to the processing area during said patterning to create a pattern selective temperature field profile across the processing area such that different pattern regions of the processing area are subjected to different pattern selective temperatures differently affecting one or more parameters of said patterning process being applied to the processing area of the structure.

23. The method according to claim 22, wherein said one or more parameters comprises a rate of said process.

24. The method according to claim 22, wherein said pattern selective temperature profile creates different rates of said process being applied to the different pattern regions of the processing area.

25. The method according to claim 22, wherein said data indicative of the pattern map is indicative of an arrangement of the different pattern regions having different pattern densities within the processing area; and said absorption map data comprises data indicative of absorption spectra of the different pattern regions having different pattern densities within the processing area.

26. The method according to claim 22, wherein said material removal tool comprises a heating source, generating a temperature field profile across the processing area of the structure.

27. The method according to claim 26, comprising controlling operation of the heating source in accordance with the pattern map within the processing area, so as to create the pattern selective temperature profile across said processing area providing desired pattern selective distribution of said one or more parameters, said controlling comprising analyzing the input data and generating operational data to the heating radiation source being indicative of one or more selected parameters of heating radiation to be applied to the processing area for pattern selective heating of one or more selected regions of the processing area.

28. The method according to claim 27, wherein said one or more selected parameters of the heating radiation comprise one or more of the following: spectral parameters; a spectral range of the heating radiation, polarization, intensity, heating radiation application time, pulse duration, number of pulses per step, number of steps.

29. The method according to claim 27, wherein said one or more selected parameters of the heating radiation comprise at least one of the following: (i) selected spectral range, comprising a spectral range of a relatively weak absorption by one or more regions of the processing area having relatively low pattern density, as compared to that of said one or more selected regions having relatively high pattern density; and (ii) selected spectral range comprising a spectral range of a relatively weak absorption by one or more regions of the processing area having relatively high pattern density, as compared to that of said one or more selected regions having relatively low pattern density.

30. The method according to claim 26, wherein said heating radiation source is configured and operable as the material removal tool for performing a fine material removal process stage on the processing area of the structure after a rough CMP process stage in single or multiple steps.

* * * * *